United States Patent
Tsao

(10) Patent No.: US 7,972,186 B2
(45) Date of Patent: Jul. 5, 2011

(54) ELASTIC SHEET STRUCTURE

(75) Inventor: Mei-Tsu Tsao, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 0 days.

(21) Appl. No.: 12/749,647

(22) Filed: Mar. 30, 2010

(65) Prior Publication Data

US 2011/0009013 A1    Jan. 13, 2011

(30) Foreign Application Priority Data

Jul. 10, 2009    (CN) .......................... 2009 1 0304227

(51) Int. Cl.
*H01R 4/02* (2006.01)
(52) U.S. Cl. ...................................................... 439/876
(58) Field of Classification Search .................. 439/876, 439/857, 82
See application file for complete search history.

(56) References Cited

U.S. PATENT DOCUMENTS

| | | | | |
|---|---|---|---|---|
| 3,585,576 A | * | 6/1971 | Meyers | 439/746 |
| 3,609,654 A | * | 9/1971 | Wallo | 439/746 |
| 3,694,792 A | * | 9/1972 | Wallo | 439/412 |
| 3,915,544 A | * | 10/1975 | Yurtin | 439/786 |
| 4,003,617 A | * | 1/1977 | Witek et al. | 439/80 |
| 4,076,355 A | * | 2/1978 | Olsson et al. | 439/82 |
| 4,274,696 A | * | 6/1981 | Long et al. | 439/395 |
| 5,131,853 A | * | 7/1992 | Meyer | 439/82 |
| 6,051,781 A | * | 4/2000 | Bianca et al. | 174/351 |
| 6,579,125 B1 | * | 6/2003 | Nagahata et al. | 439/629 |
| 7,581,965 B1 | * | 9/2009 | Upasani et al. | 439/82 |
| 2004/0214480 A1 | * | 10/2004 | Kitajima | 439/876 |

* cited by examiner

*Primary Examiner* — Jean F Duverne
(74) *Attorney, Agent, or Firm* — Steven M. Reiss

(57) ABSTRACT

An elastic sheet structure includes a plate portion, two wedged portion formed at opposite sides of the plate portion, and a latching portion formed another side of the plate portion. The wedged portion and the latching portion can be formed by bending two extending portions of the plate portion downwardly, the wedged portion is used to resist with a circuit board, the latching portion is for insertion into a hole of the circuit board to latch with the circuit board.

12 Claims, 6 Drawing Sheets

ELASTIC SHEET STRUCTURE

BACKGROUND

1. Technical Field

The disclosure relates to conductive contacts, particularly to an elastic sheet structure used in a portable electronic device to electrically connect the electrical components therebetween.

2. Description of Related Art

Electronic products are often equipped with elastic sheet structures between electronic components and a circuit board to electrically connect the electrical components to the circuit board. However, the elastic sheet structures are welded to the electronic components or circuit boards, and accordingly are difficult to replace if needed.

Therefore, there is room for improvement within the art.

BRIEF DESCRIPTION OF THE DRAWINGS

Many aspects of the present elastic sheet structure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the diagrams.

DETAILED DESCRIPTION

Figure 1:
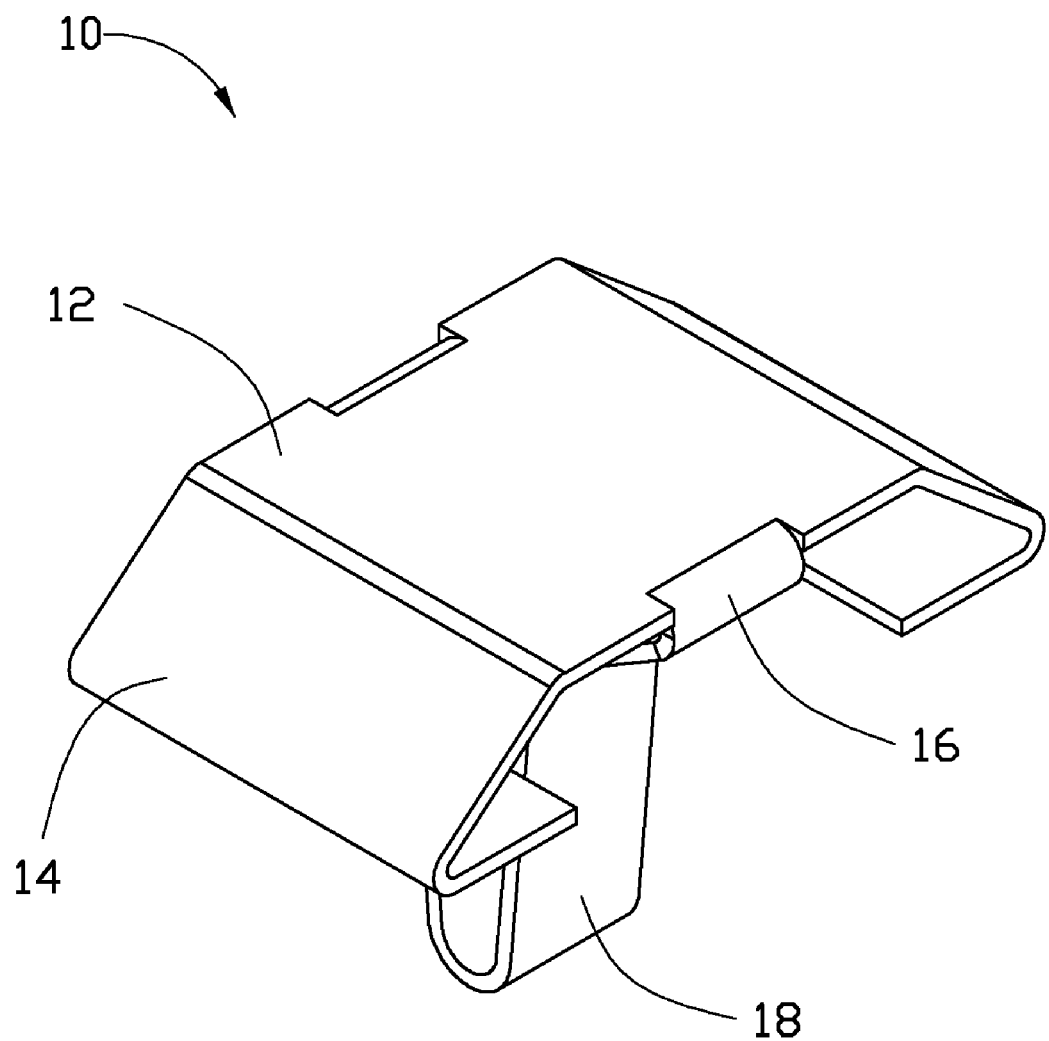
FIG. 1 is a perspective schematic top view of an elastic sheet structure according to a exemplary embodiment.
Figure 2:
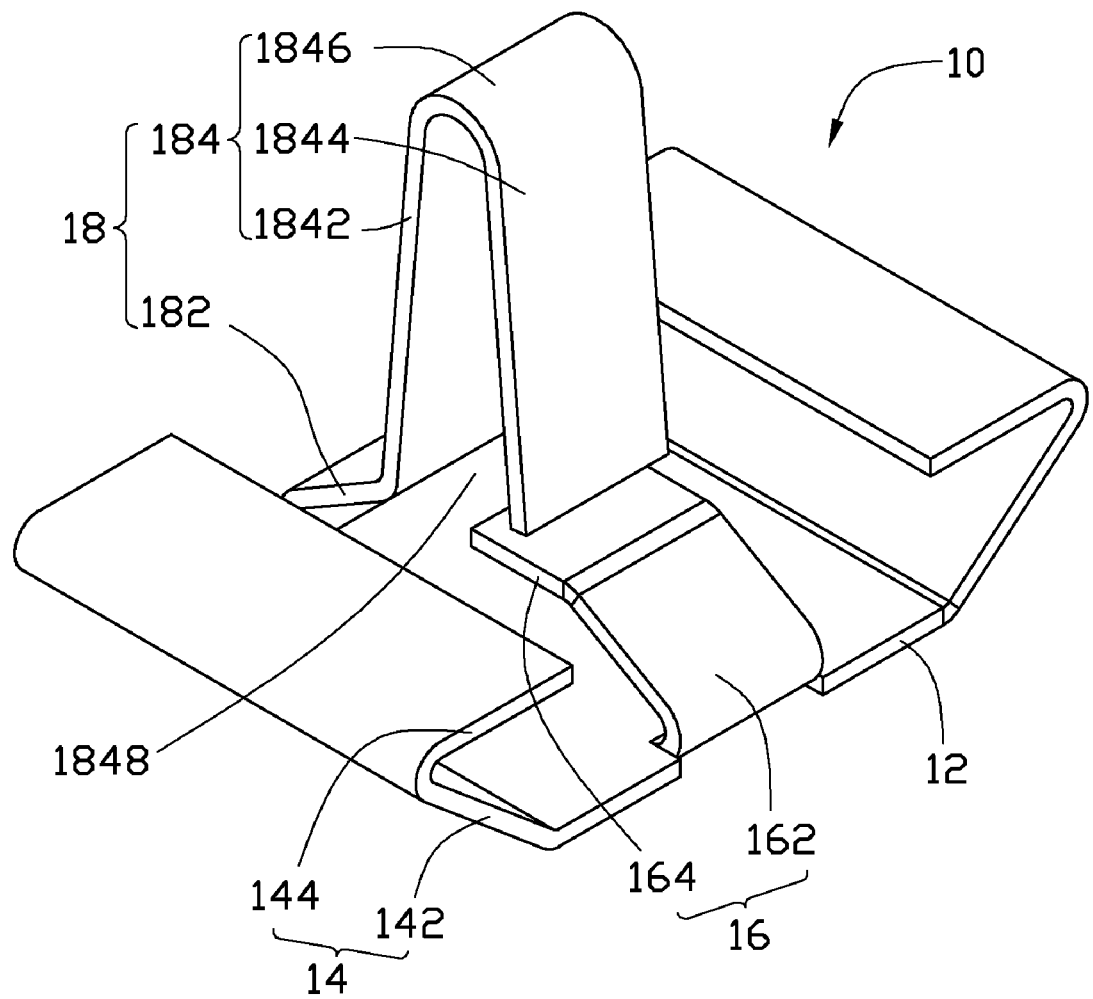
FIG. 2 is a perspective schematic bottom view of the elastic sheet structure shown in FIG. 1.

FIG. 1 and FIG. 2 show a first exemplary elastic sheet structure 10. The elastic sheet structure 10 provides electrical connection between electronic components and a circuit board of an electronic device (not shown). The elastic sheet structure 10 can be formed by punching and bending a metallic sheet.

The elastic sheet structure 10 includes a plate portion 12, two first wedged portions 14, a second wedged portion 16 and a latching portion 18. The plate portion 12 is a substantially rectangular plate and can be electronically connected to electronic components or a circuit board. The two first wedged portions 14 are formed at opposite sides of the plate portion 12 respectively. The first wedged portions 14 can be formed by bending an extending portion of the periphery of the plate portion 12. The wedged portion 14 includes a first wedged section 142 and a second wedged section 144. The first wedged section 142 extends laterally and downwardly relative to the plate portion 12. The second wedged section 144 can be formed by bending the distal end of the first wedged section 142, and the second wedged section 144 is parallel with the plate portion 12. The second wedged portion 16 and the latching portion 18 are formed on opposite ends of the plate portion 12. The second wedged portion 16 is also slanted relative to the plate portion 12. The second wedged portion 16 includes a first wedged section 162 and a second wedged section 164. The first wedged section 162 of second wedged portion 16 is slanted in a direction towards between the first wedged portions 14. The second wedged section 164 can be formed by bending the distal end of the first wedged section 162 and is parallel to the plate portion 12.

The latching portion 18 can be formed as a folded extension of the plate portion 12. The latching portion 18 is for insertion into a hole 22 of a circuit board 20 to latch with the circuit board 20. Hole 22 is perpendicular to the major operating surface 20a of circuit board 20. The latching portion 18 includes a slanted section 182 opposite to the first wedged section 162, and a latching section 184. The latching section 184 is generally V-shaped and includes a resisting section 1842 connected to the slant section 182, a hook section 1844, and an arcuate connecting section 1846 connecting the resisting section 1842 to the hook section 1844. The resisting section 1842, the hook section 1844, and the connecting section 1846 enclose a substantially V-shaped opening 1848. When the hook section 1844 is pressed toward the resisting section 1842, the hook section 1844 deformably approaches the resisting section 1842, narrowing the opening 1848.

Figure 3:
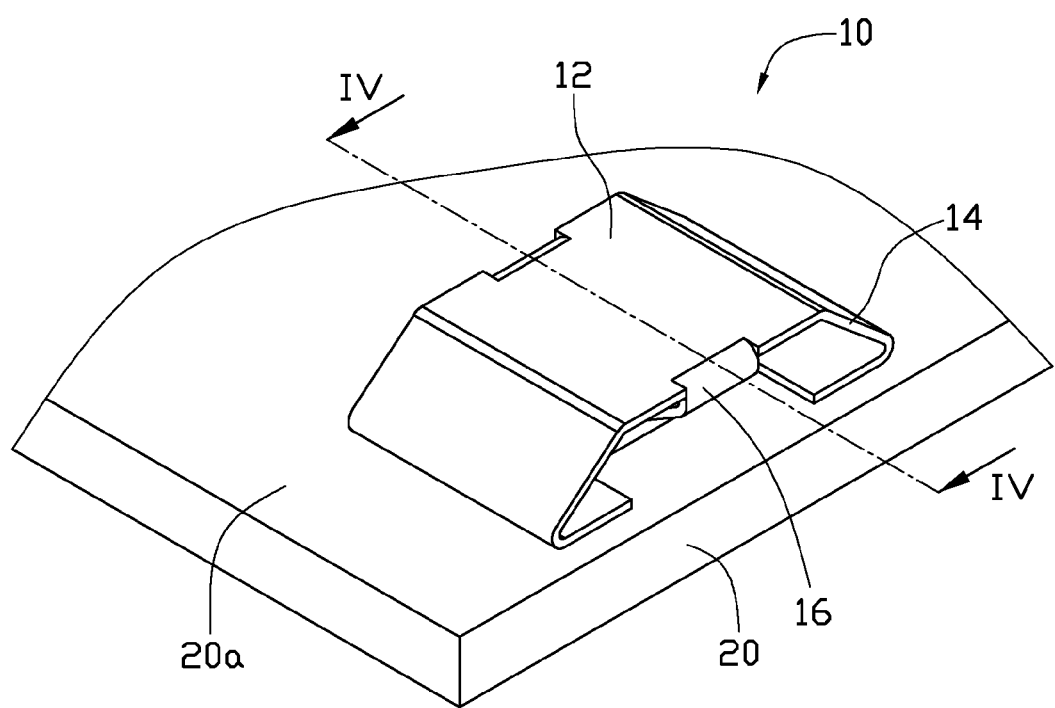
FIG. 3 is an assembled schematic view of the elastic sheet structure with a circuit board.
Figure 4:
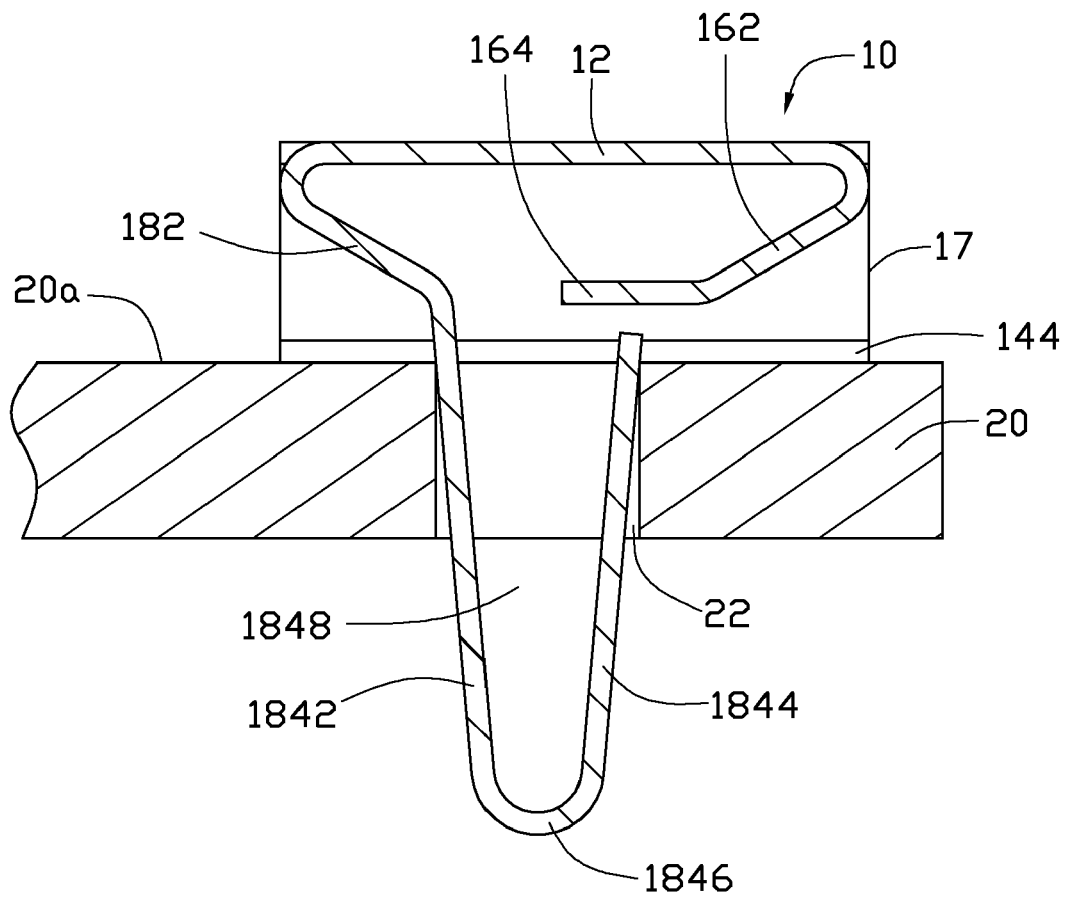
FIG. 4 is a sectional schematic view of the elastic sheet structure along line IV-IV shown in FIG. 3.

Referring to FIGS. 3 and 4, the elastic sheet structure 10 is assembled to a circuit board 20. The latching section 184 of the elastic sheet structure 10 is inserted into a hole 22 of the circuit board 20, the resisting section 1842 and the hook section 1844 elastically resist against the sidewalls of the hole 22 respectively, narrowing the opening 1848. The two second wedged sections 144 can be affixed on the surface of the circuit board 20.

Figure 5:
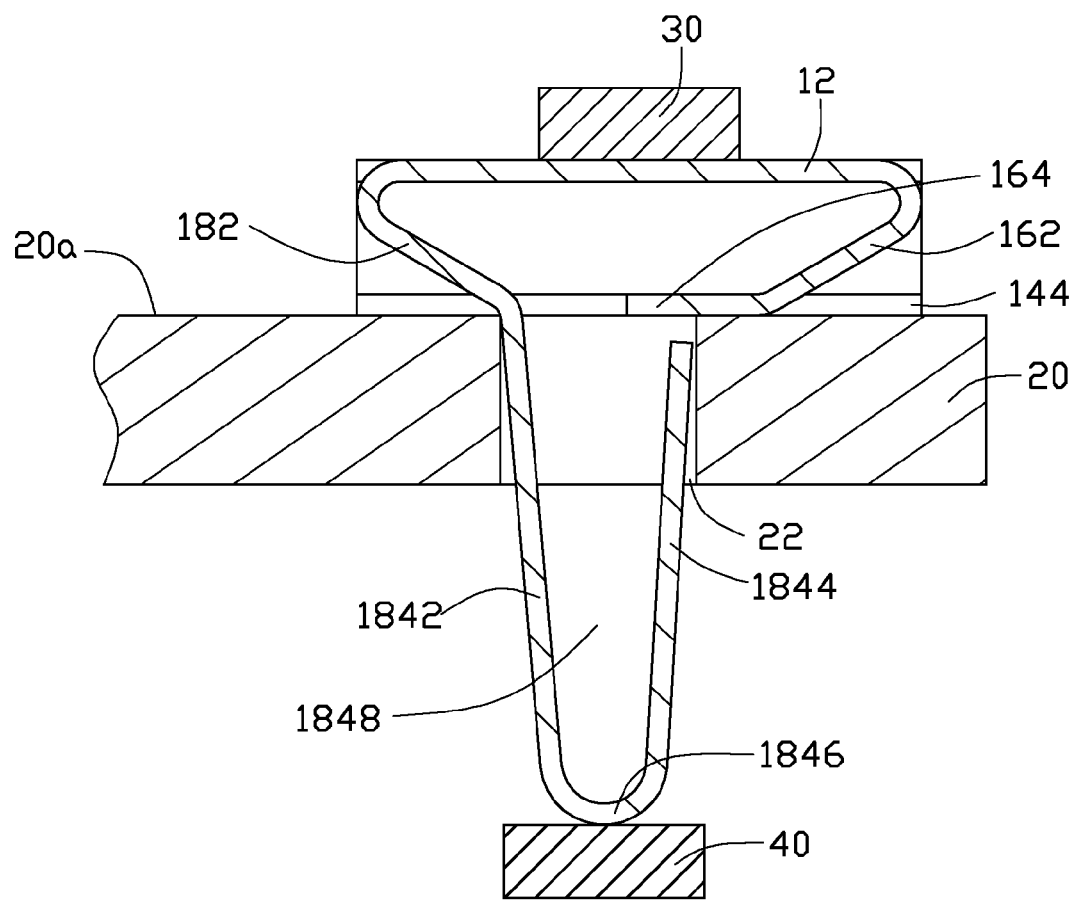
FIG. 5 is a sectional view of the elastic sheet structure assembled with the circuit board and two electronic components.

Referring further to FIG. 5, the elastic sheet structure 10 is applied to electronically connect a first component 30 and a second component 40 to the circuit board 20. The first component 30 is placed on the plate portion 12, and the connecting section 1846 of the latching section 184 is electronically connected to the second component 40. As the first component 30 is pressed further down, the two first wedged portions 14 deform, and the plate portion 12 moves toward circuit board 20 until the second wedged section 164 abuts against the surface of the circuit board 20. Thus, the elastic sheet structure 10 electronically connects the components 30, 40 securely to the circuit board 20 securely.

Figure 6:
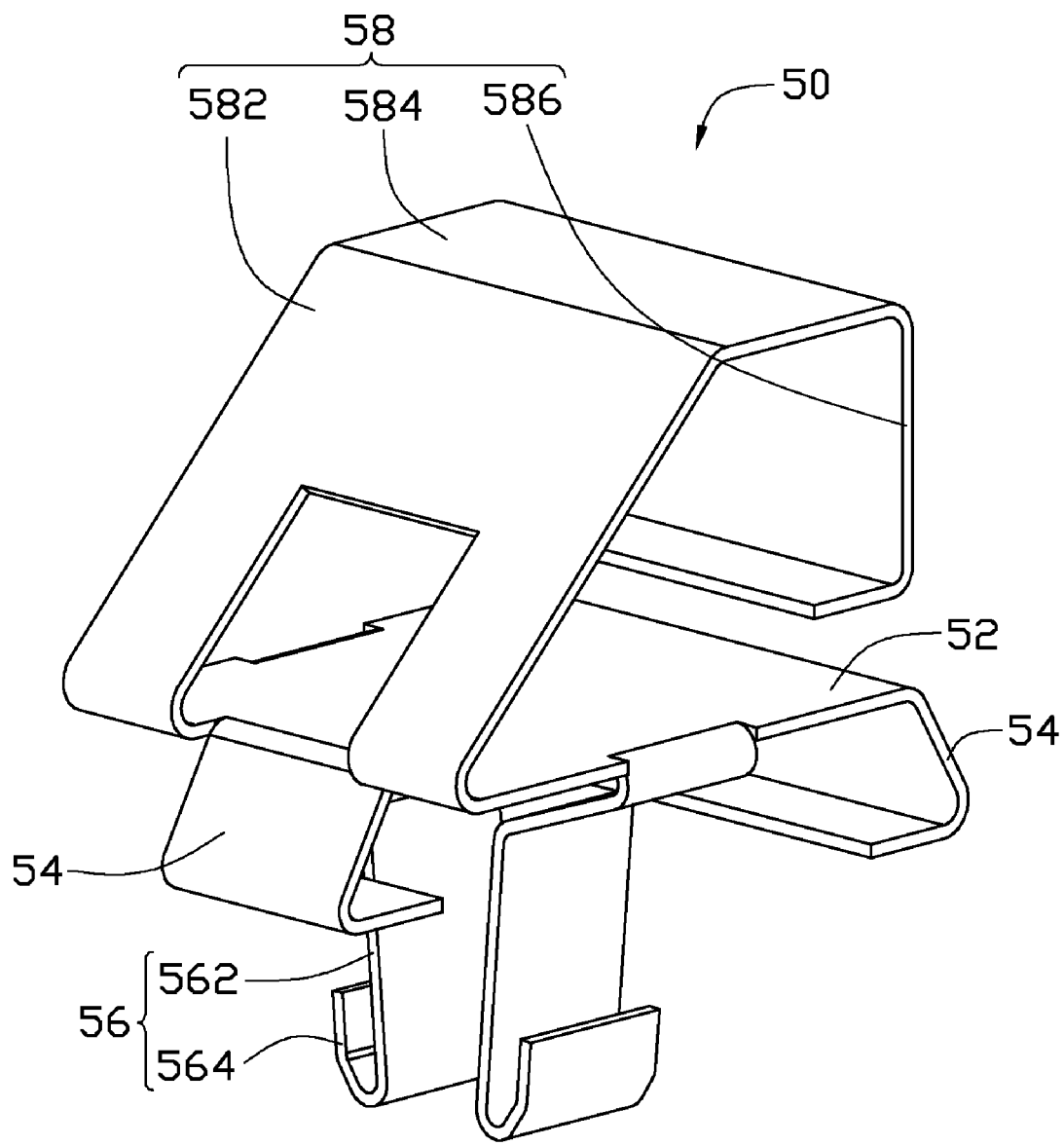
FIG. 6 is a perspective schematic top view of an elastic sheet structure according to another exemplary embodiment.

Referring to FIG. 6, another elastic sheet structure 50 according to a second exemplary embodiment is shown. The elastic sheet structure 50 includes a plate portion 52, two wedged portions 54, two latching portions 56, and a resisting portion 58. The two wedged portions 54 are formed at opposite sides of the plate portion 52, the wedged portions 54 are structured similar to the wedged portions 14 described in the first embodiment, each wedged portion 54 bends down at the corresponding side of the plate portion 52. The two wedged portions 54 are used to resist against a circuit board. The two latching portions 56 are formed at other opposite sides of the plate portion 52, each latching portion 56 has a resisting section 562 and a hook section 564 formed at a distal end of the resisting section 562, the resisting section 562 is positioned under the plate portion 52 and slanted relative to the plate portion 52. The hook section 564 is used to latch to the circuit board. The resisting portion 58 can be formed by upwardly bending an extending portion of the periphery of the plate portion 52. The resisting portion 58 includes a connecting section 582, a fixing section 584, and a limiting section 586. The connecting section 582 is slanted and connects the plate portion 52 to the fixing section 584; the fixing section 584 is above and parallel with the plate portion 52. The limiting section 586 can be formed by perpendicularly wedged the tail end of the fixing section 584, and a space (not labeled) exists between the tail end of the limiting section 586 and the surface of the plate portion 52. The plate portion 52 can be pressed downwardly.

When the elastic sheet structure 50 is applied in an electronic device, the two latching portions 56 extend through a hole of a circuit board. The two resisting sections 562 resist against the sidewalls of the hole, and the two hook sections 564 hook the bottom surface of the circuit board. Electronic components can be placed on the top surface of the plate portion 52 and the top surface of the fixing section 584, accordingly, the electronic components are electronically and stably connected to the circuit board.

It is to be understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An elastic sheet structure for contacting a circuit board having a major surface, the circuit board defining a hole, comprising:
   a plate portion;
   two first wedged portions positioned at opposite sides of the plate portion, the two first wedged portions for resisting against the major surface of the circuit board;
   a second wedge portion and a latching portion respectively positioned at opposite ends of the plate portion, the first wedge portions, the second wedge portion and the latching portion positioned at the same side of the plate portion, the second wedged portion being lower than the first wedged portion and for resisting against the circuit board to prevent overpressing of the first wedged portions when pressing the plate portion; the latching portion for inserting into the hole to latch with the circuit board.

2. The elastic sheet structure as claimed in claim 1, wherein the latching portion is generally V-shaped and includes a resisting section and a hook section, the resisting section and a hook section elastically resists against the sidewalls of the hole respectively.

3. The elastic sheet structure as claimed in claim 1, wherein the latching portion is generally V-shaped and includes a resisting section and a hook section, the resisting section passes through the hole and the hook section hooks the circuit board.

4. The elastic sheet structure as claimed in claim 1, wherein the first wedged portion includes a first wedged section and a second wedged section, the first wedged section extends laterally and downwardly relative to the plate portion, the second wedged section can be formed by bending the distal end of the first wedged section and is parallel with the plate portion.

5. The elastic sheet structure as claimed in claim 4, wherein the second wedged portion includes a first wedged section and a second wedged section, the second wedged section of the second wedged portion is parallel with the plate portion and has a space from the second wedged section of the first wedged portion.

6. The elastic sheet structure as claimed in claim 5, wherein the latching portion includes a slant section and a latching section connecting with the slant section, the latching section is comprised form the resisting section and the hook section.

7. An elastic sheet structure for contacting a circuit board, the circuit board defining a hole, comprising:
   a plate portion;
   two first wedged portions positioned at opposite sides of the plate portion, two wedged portions for resisting against a surface of the circuit board;
   at least one latching portion positioned at an end of the plate portion and at the same side with the two wedged portions, the at least one latching portion for inserting into the hole of the circuit board to latch with the circuit board; and
   a resisting portion positioned at the opposite side relative to the two wedged portions and used to electronically connect to electronic components.

8. The elastic sheet structure as claimed in claim 7, wherein the plate portion has two latching portions formed on opposite sides, the latching portion includes a resisting section and a hook section, the resisting section passes through the hole and the hook section hooks with the circuit board.

9. The elastic sheet structure as claimed in claim 8, wherein the resisting section is slanted and under the plate portion, the hook section is folded on the tail end of the resisting section.

10. The elastic sheet structure as claimed in claim 7, wherein the resisting portion includes a connecting section, a fixing section and a limiting section, the connecting section is slanted and connects the plate portion to the fixing section, the fixing section is above and parallel with the plate portion, the limiting section is folded perpendicularly from the tail end of the fixing section.

11. A connecting structure, comprising:
    an elastic sheet structure;
    a circuit board defining a hole in a surface thereof; and
    two electronic components;
    wherein the elastic sheet structure includes a plate portion, two first wedged portions, a second wedge portion and a latching portion, the two first wedged portions are positioned at opposite sides of the plate portion for resisting against a surface of the circuit board; the second wedge portion and the latching portion are respectively positioned at opposite ends of the plate portion; the first wedge portions, the second wedge portion and the latching portion are positioned at the same side of the plate portion, the second wedged portion is lower than the first wedged portion and for resisting against the circuit board to prevent overpressing of the first wedged portions when pressing the plate portion; the latching portion is for inserting into the hole to latch with the circuit board;
    the elastic sheet structure is elastically compressed between the two electronic components, with one of the electronic components is placed on the plate portion, the latching portion passes through the hole to resist against the other electronic component and latches with the circuit board, the two first wedged portions resist against the surface of the circuit board.

12. The elastic sheet structure as claimed in claim 11, wherein the first wedged portion includes a first wedged section and a second wedged section, the first wedged section extends laterally and downwardly relative to the plate portion, the second wedged section is formed by bending the distal end of the first wedged section and is parallel with the plate portion.

* * * * *